United States Patent

Ng et al.

[11] Patent Number: 5,936,383
[45] Date of Patent: Aug. 10, 1999

[54] SELF-CORRECTING AND ADJUSTABLE METHOD AND APPARATUS FOR PREDICTING THE REMAINING CAPACITY AND RESERVE TIME OF A BATTERY ON DISCHARGE

[75] Inventors: Patrick Kwok-Yeung Ng, Plano; Marc D. Hirsch, Dallas, both of Tex.

[73] Assignee: Lucent Technologies, Inc., Murray Hill, N.J.

[21] Appl. No.: 09/054,143

[22] Filed: Apr. 2, 1998

[51] Int. Cl.⁶ .......................... H01M 10/44; H01M 10/46
[52] U.S. Cl. ...................................... 320/132; 320/DIG. 21
[58] Field of Search ...................................... 320/124, 127, 320/128, 131, 132, 134, 136, 150, 153, DIG. 19, DIG. 21; 324/427, 431; 340/636

[56] References Cited

U.S. PATENT DOCUMENTS

| 5,631,540 | 5/1997 | Nguyen | 320/127 |
| 5,652,502 | 7/1997 | van Phuoc et al. | 320/134 X |
| 5,751,134 | 5/1998 | Huerner et al. | 320/124 |

Primary Examiner—Edward H. Tso
Attorney, Agent, or Firm—Locke Liddell & Sapp LLP

[57] ABSTRACT

A self-correcting and adjustable apparatus and method of predicting remaining capacity (Q) and reserve time (t) of a discharging battery to a selected end voltage determined by an arrangement considering the open circuit voltage ($E_{oc}$), battery voltage (V) battery temperature (T) and battery internal resistance ($R_{int}$). The apparatus and method of the present invention utilize a calculation process which first compares calculated and measured capacity discharged between two times ($Q_{dis.calc.} - Q_{dis.act.}$). If this difference exceeds a certain predetermined tolerance or limit of error, the calculation process is adjusted or tuned and the comparison is repeated until the difference between the actual capacity and the calculated capacity are within a predetermined tolerance. The calculation process is tuned by adjusting the value attributed to the battery's internal resistance ($R_{int}$). A correlation between battery capacity and battery internal resistance is used to make a reasoned initial adjustment to the calculation process. Then an iterative process of successive approximations is used to tune the calculation process within a given tolerance factor. Once the calculation process has been tuned, the adjusted internal resistance ($R_{int}$) is then used for subsequent calculations of remaining battery capacity (Q) and reserve time (t). The calculation process may be tuned or adjusted initially, intermittently, or throughout the battery discharge.

37 Claims, 4 Drawing Sheets

SELF-CORRECTING AND ADJUSTABLE METHOD AND APPARATUS FOR PREDICTING THE REMAINING CAPACITY AND RESERVE TIME OF A BATTERY ON DISCHARGE

FIELD OF THE INVENTION

The present invention relates to an apparatus and method for measuring and predicting the remaining capacity and reserve time of a discharging battery. More particularly, it is concerned with a self-correcting and adjustable apparatus and method for predicting the remaining capacity and reserve time of lead acid batteries during discharge to an end voltage.

BACKGROUND OF THE INVENTION

A battery is a device used to store electrical energy. The process of storing electrical energy or power into a battery is referred to as charging the battery. Conversely, the process of removing or using the stored electrical energy from a battery is referred as discharging the battery. The total amount of energy which can be stored in a battery, i.e. a battery's total capacity, depends on the type, size, and age of the battery. The amount of electrical energy stored in a battery is typically referred to as a battery's capacity (Q) and is measured in units of ampere-hours (AH). The unit ampere-hours is indicative of the inverse relationship between a battery's remaining capacity or reserve time and the current being supplied by the battery. Specifically, the greater the current being supplied by the battery, the faster the battery discharges, and thus, the shorter the time the battery can supply such current before completely discharging its stored capacity of electrical energy. Conversely, the smaller the current supplied, the slower the battery discharges, and the longer the battery can supply such current before becoming completely discharged.

The uses of batteries to supply electrical power are as varied as the electrical devices or systems in which they are used. As electrical devices and systems have become increasingly prevalent in consumer and industrial applications, there has been a corresponding increase in the use of batteries. Some electrical systems such as portable electronic devices (i.e., mobile phones, portable computers, radios, hand tools, watches, etc.) use batteries as their primary source of electrical energy. Other electrical systems or devices receive their primary electrical power supply from a power source such as a generator, power plant, or line power supply. Even these devices, however, often utilize batteries as a back-up or secondary supply of electrical power. In such a battery-backed system, if the primary power source fails, the battery can be used to supply electrical power until the primary power supply is reinstated. This scheme of redundant power sources is often utilized in electrical devices or systems in which a temporary loss of power is problematic. Such systems include very complex as well as relatively simple applications. Examples include alarm clocks, where a loss of power could result in the clock losing track of the proper time thus resulting in a false or a late alarm; computers, where an untimely loss of power could result in lost data; and telecommunications systems, where a loss of power could result in a shutdown of communications networks.

Since batteries can only store a limited amount of electrical energy, once that energy has been exhausted the batteries will no longer be able to supply electrical power to the electrical system or device. Obviously, for any electrical device, then, knowing how much battery capacity remains is a convenient feature since a battery's remaining capacity determines the battery's reserve time, i.e., how much longer before the battery supply is exhausted and thus how much longer the electrical device or system may be used. In electrical systems which require an uninterrupted power supply, determining when the battery power supply will be exhausted may not only be a convenient feature, but such capability may be a critical system design feature. In order to ensure an uninterrupted power supply, the remaining battery capacity and reserve time must be accurately predicted such that either the primary power supply can be restored to service, or another alternative power supply can be connected, before the battery power supply is exhausted.

To this end, several methods have been suggested to accurately and reliably predict remaining battery capacity and thus battery reserve time. The initial method used for predicting remaining battery life is strictly empirical, wherein extensive testing of the battery is conducted in order to compile a large database of characteristics indicative of the battery's performance throughout the cycle of the battery from a fully charged state to a fully discharged state. By comparing these predetermined test characteristics to the battery's actual characteristics, as measured during use, one can predict what stage of discharge the batter is in and thus how much battery capacity or reserve time remains.

For this empirical method to yield accurate and reliable results, however, the initial testing has to account for a multitude of factors which could affect the battery's performance. This means the testing must be performed under conditions matching the actual use of the battery as closely as possible. Not only does this mean testing has to be performed for each type and size battery individually, but also the testing should include other external variables such as the load on the battery as well as the battery's temperature and environment (all factors which can affect the battery's performance characteristics). The result is that there are innumerable combinations of such factors which would have to be tested for each battery in order for the empirical data to be useful and accurate for all applications. Moreover, to have test data useful for reliably predicting a specific battery's performance essentially requires duplicating the application in which the battery is going to be used. This is obviously impractical to do for all possible applications. Typically, then, the testing has been standardized by performing the tests with standard loads and standard variables for the surrounding temperature/environment for each of the different types and sizes of batteries. The data from these standardized tests, however, provides limited accuracy and reliability for predicting the remaining battery capacity and reserve time.

In addition to the costly and extensive initial testing required for this empirical method, the apparatus or equipment needed to perform this method can also be costly. Specifically, due to the large database of information required for this method, any computer or other control system using this method would require a large amount of memory to store the relatively large database of predetermined test data used for comparison. The combination of these expenses, as well as the limited usefulness of standardized data with respect to each unique application, and the resulting inaccuracy and unreliability of the predictions based on such standardized data, has made this method largely impractical.

Other more theoretical methods have been suggested to address the inherent limitations of attempting to rely strictly on such empirical methods for predicting the remaining capacity and reserve time of a battery. The fundamental method of prediction, of the prior art, is based on the Peukert equation:

$$t = aI^b$$

where (t) is the reserve time to a given end voltage, (I) is the discharge current and (a) and (b) are empirically determined parameters. The remaining reserve time during discharge is obtained by subtracting the actual time of discharge from the value (t) given by the equation. The only real time data used in this approach is the discharge current (I), while the parameters (a) and (b) must again be experimentally predetermined by extensive testing, data acquisition, and parametric analysis. Since these parameters are empirically derived, the values of these parameters are fixed and do not adapt to changing conditions affecting battery performance such as changing load requirements, temperature, or ageing of the battery.

An attempt to be more responsive to changes in battery behavior during discharge is disclosed in the patent application Ser. No. 08/013272, filed Feb. 4, 1993, submitted by D. Levine et al. which utilizes matrices of predetermined parameters that correlate the slope of the voltage-versus-discharge time at various discharge currents, battery voltages during discharge, and end voltages. The use of voltage-versus-time slopes for prediction allows the method to be highly adaptable to changes in battery behavior during discharge. This method, however, also requires extensive initial testing to derive the data to populate the matrices.

Another approach, disclosed by R. Biagetti and A. Pesco in U.S. Pat. No. 4,952,862, operates by measuring the difference between battery voltage during discharge and the battery plateau voltage, $$V_{battery} - V_P.$$

During discharge this difference is plotted against a ratio of discharged capacity to the total discharge capacity available:

$$Q_{removed}/Q_{to-end-voltage}.$$

This plot, created from measured data, is a single curve having an exponential and a linear region. The curve can then be used to determine remaining capacity and reserve time from the measured discharged capacity ($Q_{removed}$) and the plateau voltage ($V_p$). As in the above described method, extensive prior testing and data analysis of the particular battery being monitored is required, and the method does not account for ageing of the battery since the plateau voltage ($V_p$) is a predetermined fixed value.

Another approach in determining the reserve time of a discharging battery, disclosed in U.S. Pat. No. 4,876,513, takes advantage of the fact that when battery voltages (corrected for internal resistance) are plotted versus a ratio of ampere-hours remaining to ampere-hours available to a certain discharge voltage, all discharge curves fall on a single curve. The battery voltages are calculated using a battery internal resistance that is measure periodically during discharge.

Although moderately effective, none of these preexisting methods for evaluating the state of a discharging battery works accurately at all temperatures, requires only a minimal number of empirically derived parameters, is independent of the battery size being monitored, and adapts to changing conditions affecting battery performance. In response to these deficiencies, Trung V. Nguyen developed a more accurate apparatus and method of predicting remaining battery capacity (Q) and reserve time (t) of a discharging battery to a selected end voltage. The method is disclosed in U.S. Pat. No. 5,631,540 and is primarily based on measurable battery parameters which do not require extensive pretesting of the battery. The battery reserve time (t) of a discharging battery is determined by an arrangement considering the discharge current (I), battery voltage (V), battery temperature (T), and the battery's internal resistance ($R_{int}$). The remaining battery capacity (Q) is determined from the ratio between a maximum theoretical capacity ($Q_{max}$) and its present capacity (Q). A term defined by a sum of the battery full charge open circuit voltage ($E_{oc}$) and the voltage loss due to the internal resistance of the battery ($IR_{int}$) and the battery voltage on discharge (V) divided by the battery temperature (T), is computed as the temperature-corrected battery overvoltage ($\eta$):

$$\eta = \frac{Eoc - IRint - V}{T}.$$

The characteristics of the battery discharge are reduced to a ratio of the remaining battery capacity to maximum theoretical capacity:

$$\frac{Q}{Q_{max}}.$$

This normalized battery capacity value is plotted versus the temperature-corrected battery overvoltage to produce a discharge characteristic curve that is invariant to discharge rates, temperatures, and battery size. This normalized battery capacity is determined by fitting parameters to the overvoltage value $\eta$ by the relation:

$$\frac{Q}{Qmax} = \text{EXP}^{(a+b\eta^c+d\eta^e)}.$$

to characterize the discharge characteristic and determine Q. A reserve time (t) can then be calculated from the determined capacity value (Q) using the relation:

$$t = \frac{Q}{I}.$$

The characteristic curve and the dynamic variables can be stored in a computer and processed continuously to provide a continuing real time prediction of the remaining capacity (Q) and reserve time (t) of the battery on discharge.

Contrary to Mr. Nguyen's belief that this method is dependent only on the battery's internal design, however, the method is not completely invariant to all external factors impacting battery performance, such as ageing, deterioration, and defects in the battery or battery connections. Accordingly, the calculation process disclosed by Nguyen produces results which, although relatively accurate as compared to previous prediction methods, are not always within an acceptable tolerance, especially when the battery exhibits changing performance characteristics over time.

More specifically, in Nguyen's method the internal resistance ($R_{int}$) is assigned a constant value equal to the internal resistance of a newly manufactured battery. In application, however, all batteries slowly begin the irreversible ageing process which results in a corresponding decrease in a battery's available capacity. This drop in capacity is partly due to the increase of internal resistance caused by water loss, grid corrosion/deterioration, temperature, or other means. Thus, predictions based on Nguyen's method can lose accuracy a the battery ages.

SUMMARY OF THE INVENTION

In accordance with the present invention, there is provided a self-correcting and adjustable method and apparatus for measuring and predicting the remaining capacity and reserve time of a discharging battery which requires minimal predetermined empirical parameters, and thus minimal pre-testing of the battery, and which accounts for the battery's changing characteristics over time.

An embodiment of the inventive method of predicting a remaining reserve capacity and reserve time of a battery during discharge, comprises the steps of: sensing a battery discharge; collecting a first set of battery parameters at a first sample time $(t_1)$ and a second set of battery parameters at a second sample time $(t_2)$, wherein the parameters collected include battery voltage (V), discharge current (I), and battery temperature (T); determining discharge capacity calculated $(Q_{dis.calc.})$ representing the battery capacity discharged between the first sample time and the second sample time using a calculation process incorporating the battery parameters; determining an actual discharge capacity $(Q_{dis.act.})$ representing the actual battery capacity discharged between the first sample time and the second sample time; determining a difference between the discharge capacity calculated $(Q_{dis.calc.})$ and the actual discharge capacity $(Q_{dis.act.})$; comparing the difference between the discharge capacity calculated $(Q_{dis.calc.})$ and the actual discharge capacity $(Q_{dis.act.})$ to a tolerance factor; adjusting the calculation process if the difference is greater than the tolerance factor; and using the adjusted calculation process to determine the remaining battery reserve capacity.

An embodiment of the inventive apparatus for predicting a remaining reserve capacity and reserve time of a battery, comprises: a battery; voltage sensing circuitry connected for sensing a voltage (V) of the battery; current sensing circuitry connected for sensing a discharge current (I) of the battery; a temperature sensing device positioned for sensing a temperature (T) of the battery; a battery monitoring unit connected to receive input from the voltage sensing circuitry, the current sensing circuitry, and the temperature sensing device, and including a reserve time prediction sub-unit having: a stored program controller for controlling and receiving input from the voltage sensing circuitry, the current sensing circuitry, and the temperature sensing device and determining if the battery is discharging; memory associated with the stored program controller and including data indicative of a battery open circuit voltage $(E_{oc})$ a battery internal resistance $(R_{int})$, a maximum theoretical capacity $(Q_{max})$, and a tolerance factor; the stored program controller including instructions for adjusting a calculation process when the difference between a discharge capacity calculated $(Q_{dis.calc.})$ and an actual discharge capacity $(Q_{dis.act.})$ exceeds the tolerance factor.

DETAILED DESCRIPTION OF THE DRAWINGS

Figure 1:
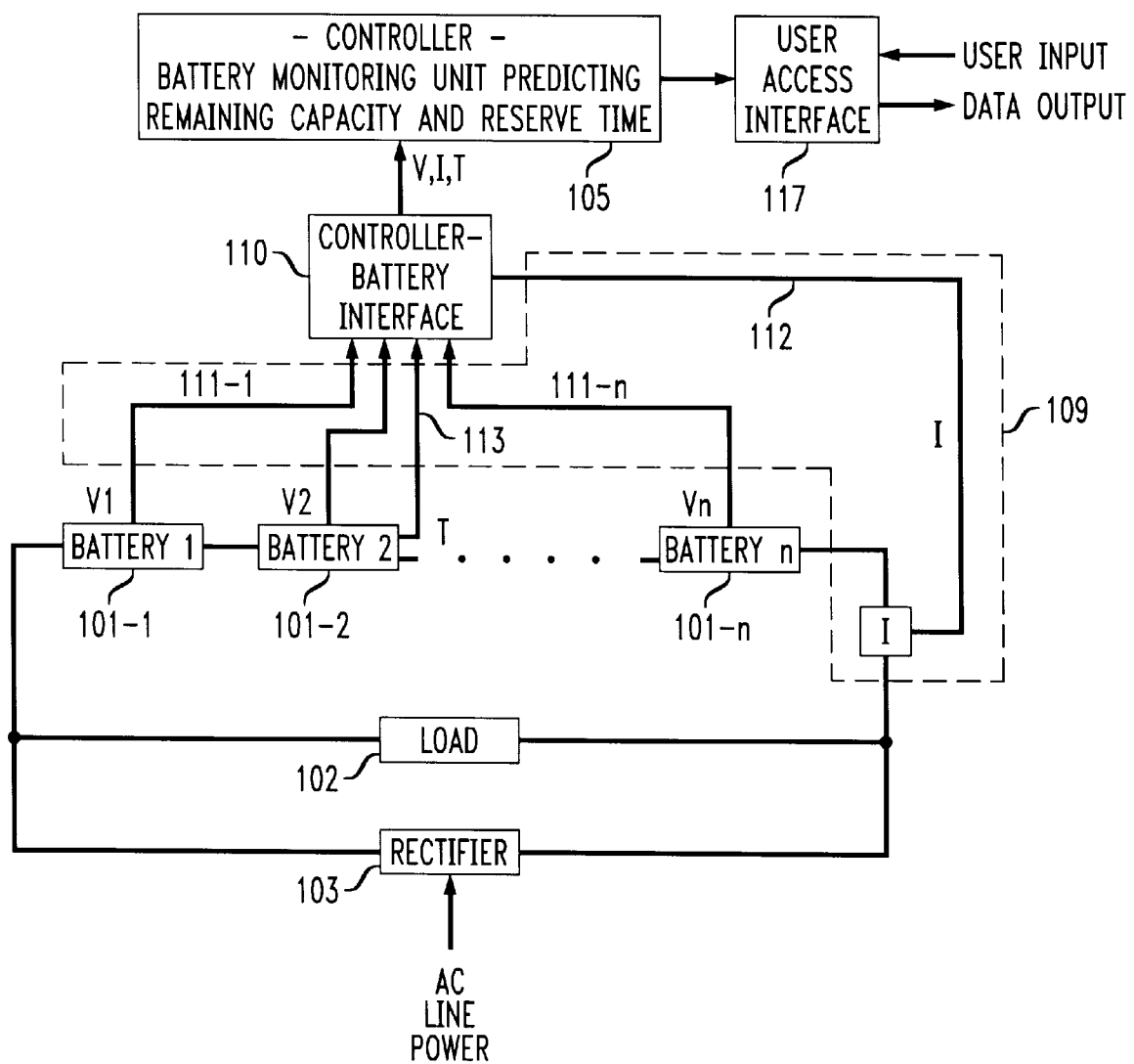
FIG. 1 is a block schematic of an electrical system incorporating an embodiment of the self-correcting adjustable battery plant and monitoring apparatus of the present invention.

FIG. 1 provides a block schematic illustrating an electrical system incorporating an embodiment of the battery plant and monitoring apparatus of the present invention. The system shown in FIG. 1 includes a main power supply 103 connected to primarily supply power to the system's load 102. The main power supply 103 typically comprises a rectifier circuit connected to AC line power in order to provide rectified voltage to the load 102. Although a rectifier tied to an AC power line is shown in FIG. 1, other primary power supplies are contemplated by the present invention such as generators, power plants, transformers, converters, and other power generating and power delivery devices.

A battery power supply 101 is connected to secondarily supply power to the load 102. More particularly, the battery power supply 101 is connected in parallel with the main power supply 103 over the load 102. With this configuration, if the main power supply 103 fails, or is otherwise interrupted, the battery power supply 101 will automatically begin to discharge in order to continue the supply of electrical power to the load 102. This configuration also allows the main power supply 103 to provide a rectified charging voltage over the battery power supply 101 to automatically and continuously recharge the battery power supply 101. This ensures that the battery power supply 101 will be fully charged and ready for use when and if the main power supply 103 fails. The battery power supply 101 shown in FIG. 1 comprises a plurality of storage devices or battery cells 101-1 to 101-n which are connected in series to provide the required voltage. Multiple such battery strings can be connected in parallel to provide additional storage capacity. Alternatively, a single battery device may be used if less storage capacity is required. The amount of battery capacity required is determined by the amount of electrical energy necessary to continue supplying power to the load 102 if the main power supply 103 fails, and the expected duration of any such failure, i.e., the time require to repair or replace the main power supply 103. The greater the battery capacity, the longer the battery power supply 101 will be able to supply electrical energy to the load 102.

A controller/battery monitoring unit 105 having stored program control responsible for monitoring the battery and predicting remaining battery capacity (Q) an reserve time (t) is connected to a controller-battery interface 110. The battery interface 110 is connected to sensing circuitry 109 which includes connections 111-1 to 111-n to sense the voltage of each battery cell $(V_1-V_n)$, a connection 112 to sense the load current (I), and a connection 113 to sense the temperature (T) of at least one battery cell. This sensing circuitry 109 allows the monitoring system to monitor the performance of each battery cell. Alternatively, if only the performance of the entire battery string 101-1 to 101-n is important, only one shunt or voltage indicator would be required to measure the voltage over the entire string, or any portion thereof. In that case, only one voltage sensing connection 111 would be required.

The controller/battery monitoring unit 105 is also connected to a user access interface 117 for receiving user input and sending data output. The battery monitoring unit 105 includes a stored program control which accepts data from the battery interface 110 and from the user input/access device 117. The data from the battery interface 110 includes the real time voltage (V), current (I), and temperature (T) of the battery plant. The data from the user access interface 117 may include a tolerance factor used in adjusting the accuracy of the calculated capacity to the actual capacity. Alternatively, such a factor may be stored in memory accessible to the battery monitoring unit 105 along with the limited number of predetermined battery characteristics required for the calculation process used in the present invention. The stored program in controller 105 includes instructions for utilizing the data for predicting a remaining charge capacity (Q) and reserve time (t) until discharge to a specified end voltage of the batteries in the array of batteries 101-1 to 101-n. This prediction is communicated through the user access interface 117 to a data output which may include communication with a distant output device.

Figure 2:
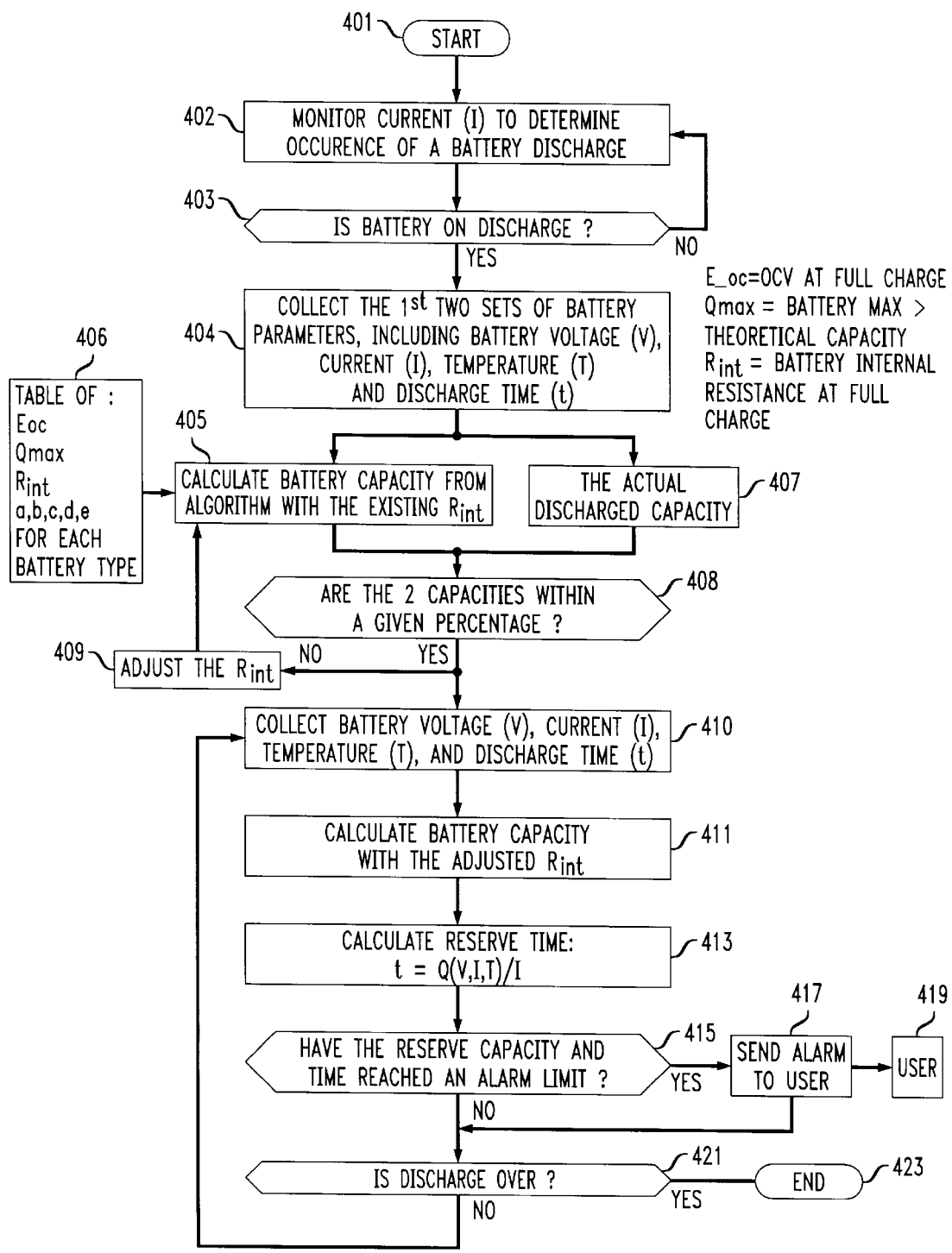
FIG. 2 is a flow graph illustrating an embodiment of the self-correcting adjustable method for predicting the remaining capacity (Q) and reserve time (t) of a discharging battery within a specified tolerance.

FIG. 2 provides a flow diagram illustrating an embodiment of the method of the present invention for predicting the remaining capacity (Q) and reserve time (t) of a discharging battery. The process starts at terminal 401 and proceeds to block 402 whose instructions require monitoring the discharge current (I) to determine the occurrence of a battery discharge. This is accomplished by having the controller/battery monitoring unit 105 retrieve the discharge current (I) sensed by the controller-battery interface 110, shown in FIG. 1. The direction of current flow indicates whether the battery is being discharged. Alternatively, the system could simply monitor the plant voltage or the load voltage. In such a system, a battery discharge can be sensed by a drop in the plant voltage or load voltage, where the drop in voltage is associated with the battery starting to supply voltage to the load.

As per the instructions in block 403, the controller continues to monitor current flow as per block 402 until the battery is discharging. Once the battery is in discharge, the battery voltage (V), current (I), and temperature (T) are measured and recorded per the instructions of block 404. Note that two sets of these parameters are measured at two different sample times ($t_1$ and $t_2$); thus, we have two sets of parameters: ($V_1$, $I_1$, $T_1$, $t_1$) and ($V_2$, $I_2$, $T_2$, $t_2$). The instructions of block 405 use each set of these monitored parameters to calculate a battery reserve capacity at time $t_1$ ($Q_1$) and at time $t_2$ ($Q_2$). The calculation process determines the remaining battery capacity at each discharge time per the relation:

$$Q(V,I,T) = (Q_{max}) \times EXP^{(a+b\eta^c+d\eta^e)}$$

where the term $\eta$ is:

$$\eta = \frac{(E_{oc} - IR_{int} - V_{battery})}{T}$$

and a, b, c, d and e are predetermined curve-fitting parameters of the discharge characteristic curve for the subject battery. By subtracting the calculated reserve capacity ($Q_2$) at the second sample time ($t_2$) from the reserve capacity ($Q_1$) calculated at the first sample time ($t_1$), the calculated amount of capacity discharged ($Q_{dis.calc.}$) from time $t_1$ to time $t_2$ is determined. The process uses a table of battery characteristics and parameters provided from memory as per block 406. The limited number of predetermined battery parameters includes the battery full charge open circuit voltage ($E_{oc}$), the battery maximum theoretical capacity ($Q_{max}$), the internal resistance of the battery ($R_{int}$), and the curve-fitting parameters (a,b,c,d and e). The curve-fitting parameters (a,b,c,d and e) are predetermined such that the characteristic discharge curve approximates the battery's actual discharge curve as closely as possible. The actual discharge curve for the battery can be measured during a discharge of the battery or can sometimes be obtained directly from the battery manufacturer. Then, using standard iterative curve-fitting techniques known to persons skilled in this area, the parameters (a,b,c,d and e) are determined such that the modeled characteristic discharge curve best fits or matches the actual discharge curve of the battery, thereby minimizing the error between the characteristic discharge curve defined by the parameters and the actual discharge curve for the battery. More specifically, the parameters are determined using parametric analysis performed on empirical data collected during discharges of the battery at different rates of discharge. Even more specifically, a nonlinear, least-square, Levenberg-Marquardt based subroutine called U4LSF from IMSL Mathematical and Statistical FORTRAN Library for mathematical applications can be used to determine the values for the parameters (a,b,c,d and e).

It should be noted that a more accurate initial calculation can be achieved by adjusting the predetermined values for the internal resistance of the batter, ($R_{int}$) and the open circuit voltage of the battery ($E_{oc}$) to account for the temperature (T) of the battery. These pre-calculation temperature adjustments are made according to the following relations:

$$R_{int} = R_{int}(@25° C.) \, EXP[f/T - f/298]$$

$$E_{oc} = E_{oc}@25° C.) + 0.0002[T-298]$$

where T is the temperature of the battery in degrees Kelvin, f is another predetermined parameter for the subject battery, and, as denoted in the relations, the stored values for the internal resistance ($R_{int}$) and the open circuit voltage ($E_{oc}$) are predetermined values of the parameters at 25° C. Although the general calculation process of the present invention will ultimately adjust to account for any change in battery performance due to temperature, by including an initial temperature adjustment the initial calculation will be more accurate and thus the number of iterations required to adjust the calculation process will be reduced.

In addition to calculating the discharged capacity, block 407 directs that the actual discharged capacity be determined by the following relation:

$$Q_{dis.act.} = \tfrac{1}{2}(t_2 - t_1)(I_1 + I_2)$$

Next, the calculated discharged capacity ($Q_{dis.calc.}$) is compared to the actual capacity discharged ($Q_{dis.act.}$) as shown in block 408. If these two capacities are not within a given percentage, or tolerance factor, the calculation process must be adjusted to ensure the accuracy of the calculation process when it is ultimately used to determine the remaining capacity (Q). Specifically, as indicated in block 409, the internal resistance of the battery ($R_{int}$) is adjusted to compensate for the difference, making the calculated discharged capacity ($Q_{dis.calc.}$) more closely approximate the actual discharge capacity ($Q_{dis.act.}$). The adjusted value for the internal resistance ($R_{int}$) is determined by successive iterations or approximations in a process generally referred to as Newton's iterative process. Essentially, this process comprises making successive adjustments to the internal resistance ($R_{int}$), determining whether the adjustments have made the calculation process more or less accurate, then readjusting the internal resistance ($R_{int}$) using interval halving, until the difference between the calculated capacity discharged ($Q_{dis.calc.}$) and the actual capacity discharged ($Q_{dis.act.}$) are within a given tolerance. This tolerance can be adjusted according to how accurate an approximation to actual is desired. Each iteration of the successive adjustments increases the accuracy of the calculation process. Thus, the iterative process is simply repeated until the calculated capacity discharged ($Q_{dis.calc.}$) more closely approximates the actual capacity discharged ($Q_{dis.act.}$).

The number of iterations required to reach an approximation with the requisite accuracy (i.e., within the given tolerance) can be significantly reduced, and thus the iterative process can be expedited, by making an intelligent or educated initial adjustment at the beginning of the iterative process. Specifically, by knowing how the battery capacity (Q) reacts to a change in internal resistance ($R_{int}$), one can make a more reasoned initial adjustment to the battery internal resistance ($R_{int}$) to effectuate the desired adjustment in the calculated capacity discharged ($Q_{dis.calc.}$) rather than simply guessing at how to adjust the internal resistance ($R_{int}$) such that the calculated capacity discharged ($Q_{dis.calc.}$) more closely approximates the actual capacity discharged ($Q_{dis.act.}$). This can be accomplished by utilizing information about the battery indicative of a correlation between the battery capacity (Q) and internal resistance ($R_{int}$). Such information can be empirically derived through experimentation or testing of the battery or can be derived from general information relating to the battery available from the manufacturer or others. By simply comparing the internal resistance ($R_{int}$) at various battery capacities (Q), one can derive a simple correlation between these two battery characteristics. This correlation can then be used to instruct the initial adjustment made to the internal resistance ($R_{int}$) ants at the start of the iterative process.

By adjusting the internal resistance of the battery ($R_{int}$), this effectively tunes the calculation process to account for any change in performance characteristics of the battery over time. Once the calculation process has been tuned or adjusted, the calculation process incorporating the adjusted internal resistance ($R_{int}$) is used for the subsequent calculations of remaining capacity (Q). It should be noted that the calculation process can be adjusted initially, intermittently, or throughout the battery discharge. FIG. 2 illustrates the embodiment in which the calculation process is adjusted initially during the discharge and then all subsequent calculations during the same discharge utilize the tuned calculation process incorporating the adjusted internal resistance ($R_{int}$). These subsequent calculations start with block 410 wherein the voltage (V), current (I), and temperature (T) are collected at each discharge time ($t_n$). The remaining capacity at time $t_n$ ($Q_n$) is calculated using the modified calculation process incorporating the adjusted internal resistance value ($R_{int}$) as noted in block 411.

If the system is designed to adjust the calculation process throughout the discharge, then at each sample time ($t_n$) the calculated capacity discharged ($Q_{dis.cacl.}$) is compared to the actual discharged capacity ($Q_{dis.act.}$) This comparison is required in order to adjust the internal resistance ($R_{int}$) for each time ($t_n$). The calculated capacity discharged ($Q_{dis.calc.}$) is determined by subtracting the calculated reserve capacity at time $t_n$ ($Q_n$) from the reserve capacity calculated at the previous sample time $t_{n-1}$ ($Q_{n-1}$) This relation would be expressed as $$Q_{dis.calc.} = Q_n - Q_{n-1}$$

The actual discharged capacity can be determined by using the relation:

$$Q_{dis.act.} = \frac{1}{2}(t_n - t_{n-1})(I_n + I_{n-1})$$

A simple comparison of the calculated discharged capacity ($Q_{dis.calc.}$) to the actual discharged capacity ($Q_{dis.act.}$) at time ($t_n$) can be made at this point and the internal resistance ($R_{int}$) can be adjusted to compensate for the difference. A more accurate approach, however, is to sum all, or some number, of the previous values for $Q_{dis.calc.}$ and $Q_{dis.act.}$. And then, compare the sums in order to adjust the internal resistance ($R_{int}$). The modified calculation process incorporating the adjusted internal resistance value ($R_{int}$) is then used to calculate the remaining capacity at time $t_n$ ($Q_n$).

Once the remaining capacity (Q) has been determined, block 413 instructs that the reserve time (t) can then be calculated by dividing the remaining capacity (Q) by the current (I).

$$t = Q(V,I,T)/I$$

A more accurate estimation of reserve time (t) can be attained by using an average current ($I_{avg}$) instead of simply using the present current measured (I). In a constant power system, an approximation of the average current ($I_{avg}$) can be determined by correlating the present measured voltage (V) and current (I) to the known end voltage ($V_{end}$), using the following relation:

$$V I = V_{end} I_{end}$$

then, $$I_{end} = \frac{VI}{V_{end}}$$

Once $I_{end}$ has been determined, an approximate average current ($I_{avg}$) can be determined using the following relation:

$$I_{avg} = \frac{I_{end} + I}{2}$$

The reserve time (t) can then be attained using the relation:

$$t = Q(V,I,T)/I_{avg}$$

The reserve time (t) can be output directly to the user and/or can be stored for later retrieval. Alternatively, as indicated in block 415, if the calculated reserve capacity and time have reached a preset alarm limit, an alarm can be output to the user access interface. The alarm is sent to the user as indicated in block 417 and block 419. If no limit has been reached, the decision block 421 determines whether the discharge condition is over. If the discharge has ended, the process is terminated as per terminal 423. If the discharge is continuing, the calculation process is repeated and the flow returns to block 411, thereby providing an ongoing real-time estimation of remaining capacity (Q) and reserve time (t) throughout the discharge. The remaining capacity and reserve time for different discharges can be compared to determine if battery replacement is needed.

Figure 3:
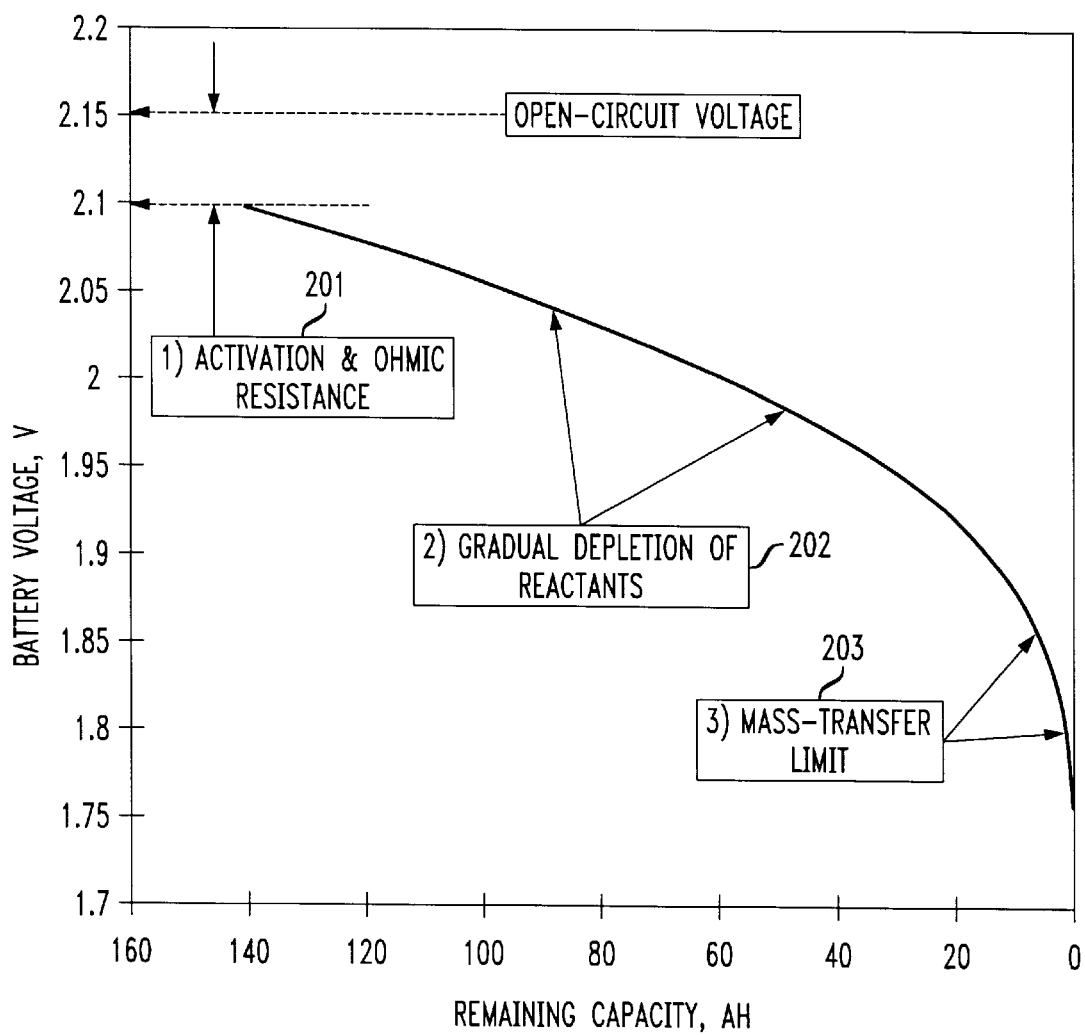
FIG. 3 is a graph of a typical battery discharge curve in terms of battery voltage versus ampere-hours remaining.

The conventional graph of battery discharge capacity is shown by the graph illustrated in FIG. 3. This discharge curve is plotted in terms of voltage versus ampere-hours. This curve exhibits three distinct characteristic regions. The initial region 201 shows an initial drop in battery voltage due to the phenomenon of activation and ohmic resistance. The second subsequent region 202, shows a gradual decrease in battery voltage due to a continuous increase in the internal resistance of the battery during discharge. This resistive increase is due to depletion of reactants and/or active surface areas in the battery. The final region 203 shows a sharp decrease in the battery voltage due to the discharge reactions becoming starved of reactants, whose transport to the electrode surfaces of the battery has become mass-transfer limited. These complex changes during discharge are believed to be related to the remaining capacity of the battery during discharge.

At the beginning of a discharge, as represented by region 201, the battery typically exhibits an erratic nonlinear drop in voltage. Accordingly, this region of the discharge curve of FIG. 3 is practically impossible to model. As a result, this region of the discharge curve of cannot be effectively used to perform predictions regarding remaining battery capacity and reserve time, and has, accordingly, not been shown in FIG. 3. To avoid beginning the calculation and monitoring process of the present invention during this initial region 201, a delay must be built into the process so that the monitoring and calculation will begin only after the battery has reached a more steady portion of the discharge curve. It should be noted that the length of the erratic region 201 depends on the rate of the discharge. If the discharge is occurring rapidly, i.e. there is a large current being drawn from the battery, the battery will reach a more steady portion of the discharge curve faster, i.e. the erratic portion of the discharge curve will be of a shorter duration. Conversely, a slow discharge, small discharge current, will increase the time required for the battery to reach a steady discharge. By monitoring the discharge current (I), the length of the delay incorporated in the process of the present invention can be adjusted relative to the amount of discharge current (I) in order to account for the rate of discharge of the battery.

Figure 4:
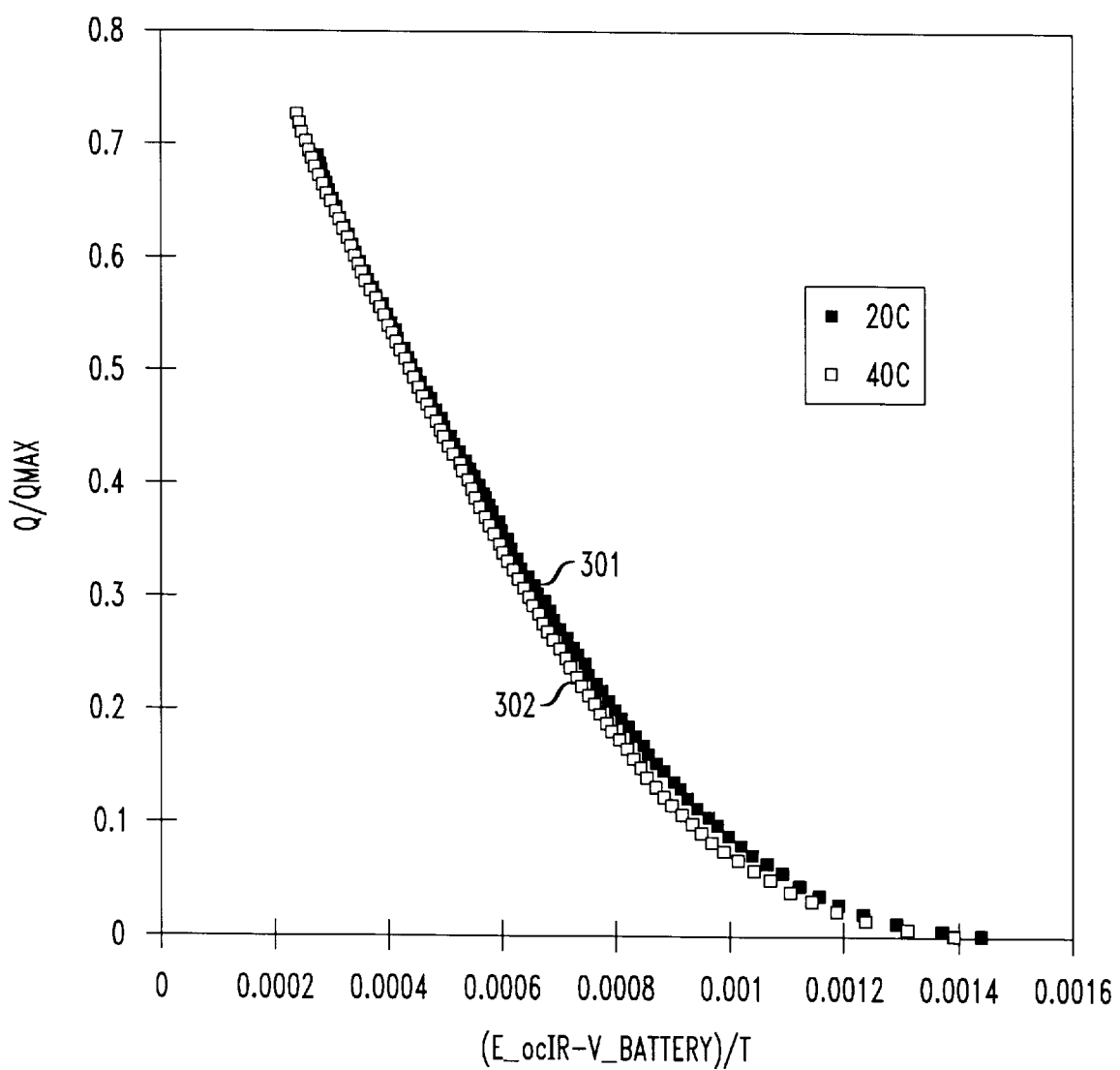
FIG. 4 is a graph of a typical battery discharge curve in terms of charge ratio versus temperature-corrected battery overvoltage.

In FIG. 4, the discharge characteristic of a battery is plotted as a ratio of remaining capacity/maximum theoretical capacity ($Q/Q_{max}$) versus the temperature corrected battery overvoltage ($\eta$). While the actual capacity (Q) may be used in place of ($Q_{max}$), the ratio is invariant to battery size. The remaining capacity to an end voltage, at a given battery voltage, is calculated from the difference between the remaining capacity (Q) at that battery voltage and the remaining capacity at that end voltage ($Q_{end}$). The effect of temperature on discharge is shown in the graph of FIG. 4, which illustrates discharge curves 301 and 302 of the same battery at two different temperatures.

While the invention has been particularly shown and described with respect to specific embodiments thereof, it is to be understood that various changes in form and detail may be made hereto without departing from the spirit and scope of the present invention and shall be encompassed within the scope of the appended claims.

What is claimed is:

1. A method of predicting a remaining reserve capacity and reserve time of a battery during discharge, comprising the steps of:
    a) sensing a battery discharge;
    b) collecting a first set of battery parameters at a first sample time ($t_1$) and a second set of battery parameters at a second sample time ($t_2$), wherein said parameters collected include battery voltage (V), discharge current (I), and battery temperature (T);
    c) determining a discharge capacity calculated ($Q_{dis.calc.}$) representing the battery capacity discharged between said first sample time and said second sample time using a calculation process incorporating said battery parameters;
    d) determining an actual discharge capacity ($Q_{dis.act.}$) representing the actual battery capacity discharged between said first sample time and said second sample time;
    e) determining a difference between said discharge capacity calculated ($Q_{dis.calc.}$) and said actual discharge capacity ($Q_{dis.act.}$);
    f) comparing said difference between said discharge capacity calculated ($Q_{dis.calc.}$) and said actual discharge capacity ($Q_{dis.act.}$) to a tolerance factor;
    g) adjusting said calculation process if said difference is greater than said tolerance factor; and
    h) using the adjusted calculation process to determine the remaining battery reserve capacity.

2. The method as described in claim 1, further comprising the steps of:
    i) using the remaining battery reserve capacity to determine the reserve time of the battery.

3. The method as described in claim 1, further comprising the steps of:
    i) displaying the remaining battery capacity to a user access interface.

4. The method as described in claim 2, further comprising the steps of:
    j) displaying the battery reserve time to a user access interface.

5. The method as described in claim 1, further comprising the steps of:
    i) activating an alarm if the remaining battery capacity has reached a preset alarm limit.

6. The method as described in claim 2, further comprising the steps of:
    j) activating an alarm if the reserve time has reached a preset alarm limit.

7. The method as described in claim 1, wherein the steps a) through g) are repeated until said difference between said discharge capacity calculated ($Q_{dis.calc.}$) and said actual discharge capacity ($Q_{dis.act.}$) is less than or equal to said tolerance factor.

8. The method as described in claim 1, wherein the step h) is repeated until the battery discharge ends.

9. The method as described in claim 1, wherein the steps a) through h) are repeated until the battery discharge ends.

10. The method as described in claim 1, wherein the step of sensing a battery discharge comprises the steps of:
    a) monitoring a discharge current (I);
    b) determining the direction of current flow; and
    c) sensing a battery discharge if current is flowing from the battery to a load.

11. The method as described in claim 1, wherein the step of sensing a battery discharge comprises the steps of:
    a) monitoring a plant voltage ($V_{plant}$); and
    b) sensing a battery discharge when the plant voltage drops a predetermined amount.

12. The method as described in claim 1, wherein the step of sensing a battery discharge comprises the steps of:
    a) monitoring a load voltage ($V_{load}$); and
    b) sensing a battery discharge when the load voltage drops a predetermined amount.

13. The method as described in claim 1, wherein the step of collecting two sets of battery parameters at a first and second sample time ($t_1$ and $t_2$) comprises the steps of:
    a) measuring a first set of battery parameters at time ($t_1$), including battery voltage ($V_1$), discharge current ($I_1$), and battery temperature ($T_1$);
    b) storing the values of said first set of battery parameters;
    c) measuring a second set of battery parameters at time ($t_2$), including battery voltage ($V_2$), discharge current ($I_2$), and battery temperature ($T_2$); and
    d) storing the values of said second set of battery parameters.

14. The method as described in claim 1, wherein the step of determining a discharge capacity calculated ($Q_{dis.calc.}$) comprises the steps of:
  a) determining the remaining battery reserve capacity ($Q_1$) at said first sample time ($t_1$) using a calculation process;
  b) determining the remaining battery reserve capacity ($Q_2$) at said second sample time ($t_2$) using a calculation process; and
  c) determining the discharge capacity calculated ($Q_{dis.calc.}$) as the difference between the remaining battery reserve capacity ($Q_1$) at said first sample time ($t_1$) and the remaining battery reserve capacity ($Q_2$) at said second sample time ($t_2$).

15. The method as described in claim 14, wherein the calculation process to determine the remaining battery reserve capacity comprises the steps of:
  a) collecting a discharge voltage of the battery (V), a discharge current of the battery (I) and a temperature of the battery (T);
  b) determining a temperature-corrected battery overvoltage ($\eta$) defined as:

$$\eta = \frac{(E_{oc} - IR_{int} - V)}{T}$$

where $E_{oc}$ is the battery open circuit voltage, and $R_{int}$ is the internal resistance of the battery; and
  c) determining the remaining reserve capacity (Q) using a discharge characteristic curve for the battery, the curve defined by the equation:

$$\frac{Q}{Qmax} = EXP^{(a+b\eta^c+d\eta^e)}$$

where $Q_{max}$, a, b, c, d and e are predetermined parameters determined by a discharge characteristic curve of the battery.

16. The method as described in claim 15, wherein the battery open circuit voltage ($E_{oc}$) is adjusted to account for the temperature (T) using the following relation:

$$E_{oc}=E_{oc}(@25° C.)+0.0002[T-298].$$

17. The method as described in claim 15, wherein the internal resistance of the battery ($R_{int}$) is adjusted to account for the temperature (T) using the following relation:

$$R_{int}=R_{int}(@25° C.) EXP[f/T-f/298]$$

where f is a predetermined parameter for the subject battery.

18. The method as described in claim 1, wherein the step of determining actual battery capacity ($Q_{dis.act.}$) comprises the steps of:
  collecting a first discharge current ($I_1$) at a first sample time ($t_1$);
  b) collecting a second discharge current ($I_2$) at a second sample time ($t_2$); and
  c) determining actual battery capacity ($Q_{dis.act.}$) using the relation:

$$Q_{dis.act.}=½(t_1-t_2)(I_1+I_2).$$

19. The method as described in claim 1, wherein the step of adjusting the calculation process if said difference between the discharge capacity calculated ($Q_{dis.calc.}$) and the actual discharge capacity ($Q_{dis.act.}$) is greater than said tolerance factor comprises the steps of:
  a) determining whether the difference between the discharge capacity calculated ($Q_{dis.calc.}$) and the actual discharge capacity ($Q_{dis.act.}$) is as a result of the calculated discharge capacity being too small or too large;
  b) adjusting the battery internal resistance ($R_{int}$) based on a predetermined correlation between calculated battery capacity (Q) and battery internal resistance ($R_{int}$); and
  c) storing the adjusted value of the battery internal resistance ($R_{int}$) to be used in subsequent calculation processes.

20. The method as described in claim 19, wherein the internal resistance of the battery ($R_{int}$) is adjusted using an iterative process of successive approximations until the difference between the discharge capacity calculated ($Q_{dis.calc.}$) and the actual discharged capacity ($Q_{dis.act.}$) is less than or equal to the tolerance factor.

21. The method as described in claim 1, wherein the step of using the adjusted calculation process to determine the remaining battery reserve capacity comprises the steps of:
  a) measuring a discharge voltage of the battery (V), a discharge current of the battery (I) and a temperature of the battery (T);
  b) determining a temperature-corrected battery overvoltage ($\eta$) defined as:

$$\eta = \frac{(E_{oc} - IR_{int} - V)}{T}$$

where $E_{oc}$ is the battery open circuit voltage, and $R_{int}$ is the internal resistance of the battery; and
  c) determining the remaining reserve capacity (Q) using a discharge characteristic curve for the battery, the curve defined by the equation:

$$\frac{Q}{Qmax} = EXP^{(a+b\eta^c+d\eta^e)}$$

Where $Q_{max}$, a, b, c, d and e are predetermined parameters determined by a discharge characteristic curve of the battery.

22. The method as described in claim 2, wherein the remaining battery reserve capacity (Q) is used to determine the reserve time (t) of the battery according to the relation:

$$t = \frac{Q}{I}$$

where (I) is the discharge current.

23. The method as described in claim 2, wherein the remaining battery reserve capacity (Q) is used to determine the reserve time (t) of the battery according to the relation:

$$t = \frac{Q}{I_{avg}}$$

where ($I_{avg}$) is the average discharge current determined by the relation $$I_{avg}=½(I_{end}+I)$$

where (I) is the present discharge current and ($I_{end}$) is the end discharge current determined by the relation:

$$I_{end} = \frac{VI}{V_{end}}$$

where (V) is the present voltage and ($V_{end}$) is the end voltage.

24. The method as described in claim 1, wherein said tolerance factor is expressed as a percentage such that said difference between said discharge capacity calculated ($Q_{dis.calc.}$) and said actual discharged capacity ($Q_{dis.act.}$) must be expressed as a percentage in order to compare said difference to said tolerance factor.

25. The method as described in claim 19, wherein the step of determining a difference between said discharge capacity calculated ($Q_{dis.calc.}$) and said actual discharge capacity ($Q_{dis.act.}$) comprises the steps of:
    a) determining an actual difference by subtracting said actual discharge capacity ($Q_{dis.act.}$) from said discharge capacity calculated ($Q_{dis.calc.}$);
    b) determining a proportionate difference by dividing said absolute difference by said actual discharge capacity ($Q_{dis.act.}$); and
    c) determining a percentage difference by multiplying said proportionate difference by 100.

26. The method as described in claim 1, wherein said tolerance factor can be changed according to input from the user access interface.

27. A method of predicting a remaining reserve capacity and reserve time of a battery during discharge, comprising the steps of:
    a) waiting until a battery discharge is detected;
    b) calculating a discharge capacity calculated ($Q_{dis.calc.}$) representing the battery capacity discharged between a first sample time ($t_1$) and said second sample time ($t_2$) using a calculation process incorporating battery parameters;
    c) determining an actual discharge capacity ($Q_{dis.act.}$) representing the actual battery capacity discharged between said first sample time and said second sample time;
    d) comparing the difference between said discharge capacity calculated ($Q_{dis.act.}$) and said actual discharge capacity ($Q_{dis.act.}$) to a tolerance factor;
    e) adjusting said calculation process if said difference is greater than said tolerance factor; and
    f) using the adjusted calculation process to determine the remaining battery reserve capacity.

28. The method as described in claim 27, wherein the step of waiting until a battery discharge is detected includes a delay after the discharge begins in order to allow the battery to reach a more steady portion of its discharge curve.

29. The method as described in claim 28, wherein the length of said delay is adjusted relative to the amount of discharge current (I).

30. A method of predicting a remaining reserve capacity and reserve time of a battery during discharge, comprising the steps of:
    a) waiting until a battery discharge is sensed;
    b) monitoring battery parameters indicative of the battery performance during discharge;
    c) at a present sample time ($t_n$) during the battery discharge, calculating a discharge capacity calculated ($Q_{dis.calc.}$) representing the battery capacity discharged between said present sample time ($t_n$) and a previous sample time ($t_{n-1}$) using a calculation process incorporating said battery parameters;
    d) determining an actual discharge capacity ($Q_{dis.act.}$) representing the battery capacity discharged between said present sample time ($t_n$) and said previous sample time ($t_{n-1}$);
    e) determining a total discharge capacity calculated ($Q_{dis.calc.total}$) by summing all previous discharge capacities calculated from a first sample time ($T_1$) to said present sample time ($t_n$);
    f) determining a total actual discharge capacity ($Q_{dis.act.total}$) by summing all previous actual discharge capacities from a first sample time ($T_1$) to said present sample time ($t_n$);
    g) comparing the difference between said total discharge capacity calculated ($Q_{dis.calc.total}$) and said total actual discharge capacity ($Q_{dis.act.total}$) to a tolerance factor;
    h) adjusting said calculation process if said difference is greater than said tolerance factor; and
    i) using the adjusted calculation process to determine the remaining battery reserve capacity.

31. A method of predicting a remaining reserve capacity and reserve time of a battery during discharge, comprising the steps of:
    a) determining if a battery discharge is occurring;
    b) when a battery discharge is detected, collecting a first set of battery parameters at a first sample time ($t_1$) and a second set of battery parameters at a second sample time ($t_2$), wherein said parameters collected include battery voltage (V), discharge current (I), and battery temperature (T);
    c) calculating a discharge capacity calculated ($Q_{dis.calc.}$) representing the battery capacity discharged between said first sample time and said second sample time using said battery parameters in a calculation process, comprising the sub-steps of:
        (1) determining the remaining battery reserve capacity ($Q_1$) at said first sample time ($t_1$) using said calculation process;
        (2) determining the remaining battery reserve capacity ($Q_2$) at said second sample time ($t_2$) using said calculation process; and
        (3) determining the discharge capacity calculated ($Q_{dis.calc.}$) as the difference between the remaining battery reserve capacity ($Q_1$) at said first sample time ($t_1$) and the remaining battery reserve capacity ($Q_2$) at said second sample time ($t_2$);
    wherein said calculation process comprises the sub-steps of:
        (1) collecting a discharge voltage of the battery (V), a discharge current of the battery (I), and a temperature of the battery (T);
        (2) determining a temperature-corrected battery overvoltage ($\eta$) defined as:

$$\eta = \frac{(E_{oc} - IR_{int} - V)}{T}$$

where $E_{oc}$ is the battery open circuit voltage, and $R_{int}$ is the internal resistance of the battery; and
        (3) determining the remaining reserve capacity (Q) using a discharge characteristic curve for the battery, the curve defined by the equation:

$$\frac{Q}{Qmax} = \text{EXP}^{(a+b\eta^c+d\eta^e)}$$

where $Q_{max}$, a, b, c, d and e are predetermined parameters determined by a discharge characteristic curve of the battery;

d) determining an actual discharge capacity ($Q_{dis.act.}$) representing the actual battery capacity discharged between said first sample time and said second sample time, comprising the sub-steps of:
  (1) collecting a first discharge current ($I_1$) at a first sample time ($t_1$);
  (2) collecting a second discharge current ($I_2$) at a second sample time ($t_2$); and
  (3) determining actual battery capacity ($Q_{dis.act.}$) using the relation:

$$Q_{dis.act.} = \tfrac{1}{2}(t_1-t_2)(I_1+I_2);$$

e) determining a difference between said discharge capacity calculated ($Q_{dis.calc.}$) and said actual discharge capacity ($Q_{dis.act.}$);

f) comparing said difference between said discharge capacity calculated ($Q_{dis.calc.}$) and said actual discharge capacity ($Q_{dis.act.}$) to a tolerance factor;

g) adjusting said calculation process if said difference is greater than said tolerance factor;

h) repeating said steps a) through g) until said difference is less than or equal to said tolerance factor; and i) using the adjusted calculation process to determine the remaining battery reserve capacity.

32. Apparatus for predicting a remaining reserve capacity and reserve time of a battery, comprising:
  voltage sensing circuitry connected for sensing a voltage (V) of a battery;
  current sensing circuitry connected for sensing a discharge current (I) of the battery;
  a temperature sensing device positioned for sensing a temperature (T) of the battery;
  a battery monitoring unit connected to receive input from the voltage sensing circuitry, the current sensing circuitry, and the temperature sensing device, and including a reserve time prediction sub-unit having:
    a stored program controller for controlling and receiving input from the voltage sensing circuitry, the current sensing circuitry, and the temperature sensing device and determining if the battery is discharging;
    memory associated with the stored program controller and including data indicative of a battery open circuit voltage ($E_{oc}$), a battery internal resistance ($R_{int}$), a maximum theoretical capacity ($Q_{max}$), and a tolerance factor;
    the stored program controller including instructions for adjusting a calculation process when the difference between a discharge capacity calculated ($Q_{dis.calc.}$) and an actual discharge capacity ($Q_{dis.act.}$) exceeds said tolerance factor.

33. The apparatus as described in claim 32, further comprising a battery.

34. The apparatus as described in claim 33, wherein said battery comprises a plurality of electrical storage devices connected to provide additive storage capacity.

35. The apparatus as described in claim 32, wherein the discharged capacity is determined between a first sample time ($t_1$) and a second sample time ($t_2$) during a battery discharge;
wherein ($Q_{dis.act.}$) is determined using the relation:

$$Q_{dis.act.} = \tfrac{1}{2}(t_1+t_2)(I_1+I_2);$$

and
wherein ($Q_{dis.calc.}$) is determined as the difference between the remaining battery reserve capacity ($Q_1$) at said first sample time ($t_1$) and the remaining battery reserve capacity ($Q_2$) at said second sample time ($t_2$) as calculated using a calculation process; and
wherein said calculation process includes instructions for determining remaining battery reserve (Q) using a discharge characteristic curve for the battery, the curve defined by the equation:

$$\frac{Q}{Qmax} = \text{EXP}^{(a+b\eta^c+d\eta^e)}$$

where a, b, c, d and e are curve-fitting parameters, and $\eta$ is a temperature-corrected battery overvoltage parameter of the battery defined as:

$$\eta = \frac{(E_{oc} - IR_{int} - V)}{T}$$

where $E_{oc}$ is the battery open circuit voltage, and $R_{int}$ is the internal resistance of the battery, and includes instruction for calculating the reserve time using the relation:

$$t = \frac{Q}{I}.$$

36. Apparatus for predicting a remaining reserve capacity and reserve time of a battery in an electrical system, comprising:
  voltage sensing circuitry connected for sensing a voltage (V) of the system;
  a battery monitoring unit connected to receive input from the voltage sensing circuitry and including a reserve time prediction sub-unit having:
    a stored program controller for controlling and receiving input from the voltage sensing circuitry and determining if the battery is discharging;
    memory associated with the stored program controller and including data indicative of a battery open circuit voltage ($E_{oc}$), a battery internal resistance ($R_{int}$), a maximum theoretical capacity ($Q_{max}$), and a tolerance factor;
    the stored program controller including instructions for adjusting a calculation process when the difference between a discharge capacity calculated ($Q_{dis.calc.}$) and an actual discharge capacity ($Q_{dis.act.}$) exceeds said tolerance factor.

37. The method as described in claim 36, wherein a battery discharge is recognized by a drop in the system voltage (V).

* * * * *